(12) United States Patent
Barney et al.

(10) Patent No.: US 6,496,966 B1
(45) Date of Patent: Dec. 17, 2002

(54) PLACE AND ROUTE SCAN CHAIN PARTITIONING BY CLOCK REGIONS

(75) Inventors: C Alva Barney, Fort Collins, CO (US); Scott Ryan Grange, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 168 days.

(21) Appl. No.: 09/656,925

(22) Filed: Sep. 7, 2000

(51) Int. Cl.[7] .............................................. G06F 9/45
(52) U.S. Cl. .................................. 716/10; 716/8; 716/9
(58) Field of Search ............................. 716/3–6, 8–10, 716/12, 16–18; 714/726, 731, 744, 814, 30, 724; 713/500

(56) References Cited

U.S. PATENT DOCUMENTS 5,963,730 A * 10/1999 Toyonaga et al. ............... 716/3

* cited by examiner

Primary Examiner—Matthew Smith
Assistant Examiner—Naum Levin

(57) ABSTRACT

The present invention relates to a system and method for using a place and route CAD tool for locating scan elements within a functional block of an integrated circuit (IC) in proximity to a clock trunk line to enable efficient transmission of scan data out of the IC for diagnostic purposes. A scan enable signal is preferably directed in a direction opposite the direction of scan data propagation to ensure that a scan element in a scan chain is emptied of its data before new data is written to that element. This process of reverse scan enable signal propagation direction is preferably practiced for all elements in the scan chain. The inventive approach preferably enables automated design to be employed in the placement and routing of the scan elements while still preventing race conditions, thereby enabling a single clock to be employed for the scan chain.

24 Claims, 4 Drawing Sheets

PLACE AND ROUTE SCAN CHAIN PARTITIONING BY CLOCK REGIONS

TECHNICAL FIELD

This invention relates in general to designing integrated circuit processors which incorporate diagnostic characteristics and in particular to generating element layouts within an operational block of an integrated circuit for improved diagnostic operations.

BACKGROUND

Testability (the ability to perform diagnostic operations) is of high and growing importance in the field of integrated circuit (IC) design and production. Testability generally affects the design and manufacturing costs of ICs as well as the reliability of the final product supplied to customers. Various prior art approaches to incorporating diagnostic ability or testability in IC design have generally been limited by IC performance. Scan chains have generally been used to present a digital "snapshot" or status of a chip at a particular moment. It is generally desirable when conducting debugging operations to provide such status information to external equipment in order to evaluate the performance, functionality, and/or electrical robustness of an integrated circuit or portion thereof.

Integrated circuits are commonly designed employing "place and route" build tools in order to compose a chip prior to actual fabrication of the chip. Such place and route tools may involve either manual or automatic placement of functional elements, such as state elements and scan elements, within a functional region of an IC. Another variable in the design of testability in ICs is the design choice of employing either single clocks or non-overlapping clocks for scanning data out of an IC for diagnostic operations. The selection of manual or automated design as well as the selection of either single or non-overlapping clocks in the prior art each have their advantages and disadvantages which are discussed below.

Herein, a "race condition" is a condition wherein the relative placement of certain elements may cause the outcome of a logical operation to change and present an erroneous result based upon the rate of travel of various signal through the IC. Generally, careful design of the layout of elements in an IC may operate to prevent race conditions. An uncured race condition may operate to render an IC inoperative because of the attendant unreliability of data within such an IC.

Generally, employing manual operation permits the designer to acquire a large measure of control over the placement of various elements within the IC. This high level of control generally enables race conditions to be avoided through a careful placement of functional elements within an IC. Where race conditions are avoided through the use of careful manual design, single clocks may be employed scanning data out of the IC for diagnostic purposes. However, manually placing the elements within an IC is generally extremely expensive and time consuming and is generally cost prohibitive once the IC surpasses some reasonable threshold of complexity. Therefore, it is a problem in the art that the benefit of careful manual placement of scan elements within an IC generally imposes an unacceptable cost.

Generally, using automated design tools to place and route the various elements in an IC is far more rapid and less expensive than performing the operation manually. However, using automated design generally presents the prospect of a large number of race conditions among the elements because of the lack of control of element placement and wiring. Generally, non-overlapping clocks may be deployed to address the race conditions created through the use of automated design. However, the use of non-overlapping clocks to coordinate the scanning of data out of an IC for diagnostic purposes generally presents the problems of requiring the implementation of more complex wiring, a greater total quantity of wiring, hotter operation of the IC, greater power consumption by the IC, and slower processing speed of the IC.

In the prior art, control of race conditions and clock skew could be accomplished via the use of balanced clock trees and clock grids. However, the use of balanced clock trees tends to require an inordinate input of Engineering work effort. Moreover, use of a clock grid tends to require excessive power input. Accordingly, the use of balanced clock trees and/or clock grids does not present attractive solutions for the problems of clock skew and race conditions.

Accordingly, it is a problem in the art that the benefit of careful placement of scan elements within an IC arising from manual design generally requires excessive design time and excessive cost.

It is a further problem in the art that the use of automated design tools for the placement of scan elements in an IC generally presents the problem of race conditions which generally requires deployment of non-overlapping clocks.

It is a still further problem in the art that deploying non-overlapping clocks for the purpose of addressing race conditions causes the IC to operate hotter, slower, and to consume more energy than ICs employing single clocks.

SUMMARY OF THE INVENTION

The present invention is directed to a system and method which partitions an IC or functional block of an IC into clock regions and locates scan elements within these regions with each such region having a dedicated clock trunk line. Sequences of scan elements within each region may be connected to form scan chains along which scan data may be propagated. A plurality of such scan chains may be daisy chained in sequence so as to provide a single resulting scan chain.

In a preferred embodiment, within each clock trunk line, a scan enable signal is preferably propagated in a direction opposite the direction of propagation of scan information from the various scan elements to thereby prevent the generation of race conditions. Employing the inventive approach, each scan element will preferably transmit data to a downstream scan element (in the direction of scan chain data propagation) before data from an upstream scan element is transmitted into that scan element, thereby avoiding any accidental overwriting of data in the scan element.

Preferably, the one or more clock trunk lines are associated with a single clock, thereby enabling the IC to have a smaller quantity of wiring and reduced wiring complexity in comparison with systems employing non-overlapping clocks. Moreover, an automated design tool is preferably employed to provide initial placement of the various scan elements and to provide subsequent relocation or "snapping" of the scan elements to an appropriate clock region, thereby providing the time and cost savings of automated design over manual design.

Herein, the term "state element" generally refers to an element of an IC capable of storing a state for at least one clock cycle, the term "scan element" generally refers to an element which participates in a diagnostic operation pertaining to the IC by having its state scanned out of the IC to external equipment for diagnostic purposes, and the term "scan chain" generally refers to a sequence of devices along which scan data is transmitted.

In a preferred embodiment, a functional clock is employed to control the transmission of functional signals through elements of integrated circuits, such as, for instance, signals pertaining to mathematical operations. Scan clocks are preferably employed to control the transfer of scan data along a chain of scan elements, or scan chain.

In a preferred embodiment, scan elements are provided with an initial timing driven placement within an IC, or functional block within an IC, by an automated design tool. The design tool then preferably relocates, or "snaps" the various scan elements to the closest of one or more pre-placed clock lines. Preferably, the above approach minimizes clock skew and clock routing inside the block. The scan chain is then preferably partitioned according to the clock regions associated with the pre-placed clock lines or clock trunk lines.

Accordingly, it is an advantage of a preferred embodiment of the present invention that a scan operation employing a single clock may be combined with automated design while avoiding race conditions, thereby enabling improved cost and time efficiency in the design of an IC.

It is a further advantage of a preferred embodiment of the present invention that partitioned scan chains allow designers to explicitly control the scan routing direction and eliminate race conditions in an integrated circuit.

It is a still further advantage of a preferred embodiment of the present invention that scan chains are partitioned according to clock region in order to minimize the scan routing distance.

It is a still further advantage of a preferred embodiment of the present invention that the use of a partitioned scan chain allows designers to buffer enable signals without modifying the place and route results which generally allows for faster turnaround time in converting a schematic into artwork suitable for fabricating the IC.

It is a still further advantage of a preferred embodiment of the present invention that race conditions and clock skew may be controlled without the inordinate Engineering input required for a balanced clock tree or the excessive power requirements of a clock grid.

It is a still further advantage of a preferred embodiment of the present invention that partitioning according the clock region or "regioning" enables wire lengths between various scan elements to be reduced.

It is a still further advantage of a preferred embodiment of the present invention that regioning avoids noise and drive strength issues.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
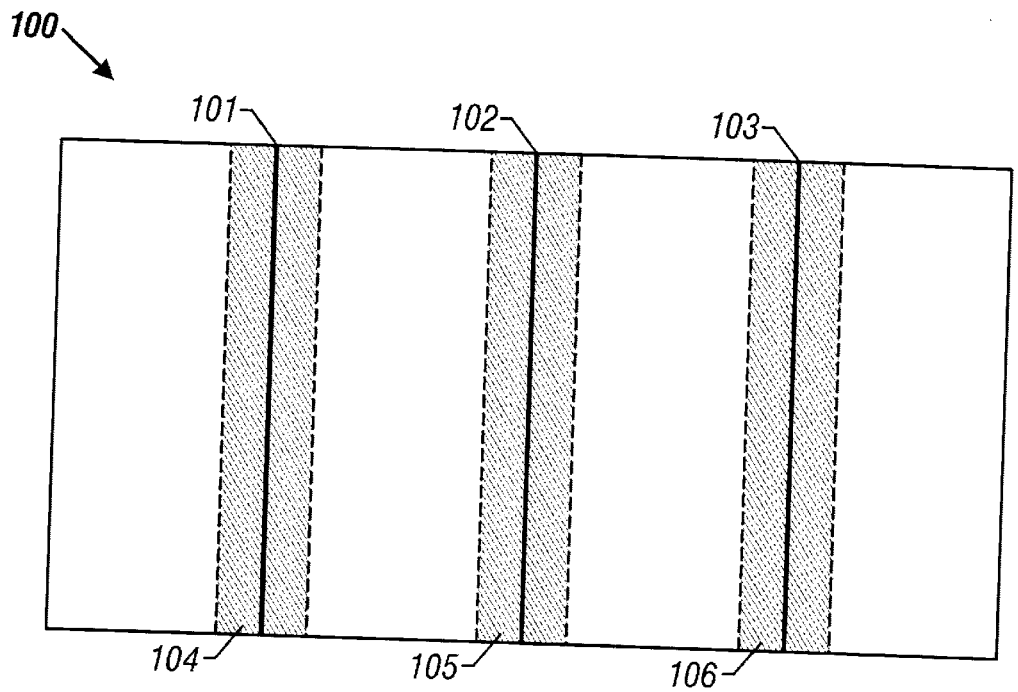
FIG. 1 depicts the placement of pre-placed clock trunk lines in an IC or functional block within an IC according to a preferred embodiment of the present invention.

FIG. 1 depicts the placement of pre-placed clock trunk lines in an IC or functional block 100 within an IC according to a preferred embodiment of the present invention. Clock trunk lines 101, 102, and 103 are shown within block 100. A clock trunk line is generally a wider than average conductive path, or wire, which may extend all the way through block 100. Block 100 may be an entire IC or a functional subset of an IC. Block 100 may represent any region of an IC on which a place and route design tool may be productively used to locate scan elements and other state elements as part of a logic design.

Clock trunk lines 101–103 are shown running in parallel. However, it will appreciated that clock trunk lines 101–103 need not be straight or parallel to one another and may be oriented in any number of different ways within block 100, and all such variations are included within the scope of the present invention.

In a preferred embodiment, clock regions 104, 105, and 106 surround clock trunk lines 101, 102, and 103 respectively. The clock regions are preferably symmetrically located with respect to each of the clock trunk lines, however, asymmetric geometric arrangements may alternatively be employed, and all such variations are included within the scope of the present invention.

In a preferred embodiment, a three step process for placing scan elements within block 100 is beneficially employed to practice the present invention. In a first step, a set of directives in the form of a "floorplan" is preferably provided to a place and route tool to help optimize eventual placement of the various scan elements. One such set of directives involves indicating the desired placement of scan-in, scan-out, and shift (or scan enable) ports within integrated circuits.

Preferably, in a second step, the place and route tool generates an initial timing driven placement to place all elements within block 100, consistent with the directives present in the above-described "floorplan," in a location which optimizes the required wire length used to achieve overall connectivity within block 100. Preferably, timing driven placement of the elements optimizes the cost function associated with the block. The cost function could include, but is not limited to: timing requirements, wire length, wire congestion, and manufacturing requirements. Timing driven placement preferably does not include scan connectivity because scan driven placement is preferably determined by the relative placement of the elements once the elements have been regioned.

Thereafter, in a third step, scan elements within block 100 are preferably relocated or "snapped" to the nearest clock region of clock regions 104–106. Placing the scan elements and/or clock elements (elements which are clock dependent) within clock regions 104–106 preferably minimizes the time delay between the propagation of signals down the various clock trunk lines and the arrival of these signals at the various scan elements.

In the simplest case, where the clock regions are functionally similar, the process of relocating or "snapping" the scan elements and/or clock elements preferably involves simply moving the affected elements to the nearest clock region among the available clock regions within block 100. However, where the clock regions differ in some functional respect, and scan elements correspond only to selected ones of the various clock regions, the scan elements are preferably snapped to the nearest clock region within the same clock domain which may or may not be physically closest clock region, depending upon the distribution of clock regions within block 100. It will be appreciated that although three clock trunk lines and clock regions are depicted in FIG. 1, fewer or more than three clock trunk lines and clock regions may be disposed within block 100, and all such variations are included within the scope of the present invention. Although clock trunk lines 101–103 are shown running all the way through block 100, it will be appreciated that the clock trunk lines could be partitioned such that each trunk line extends only a portion of the way through block 100.

Figure 2:
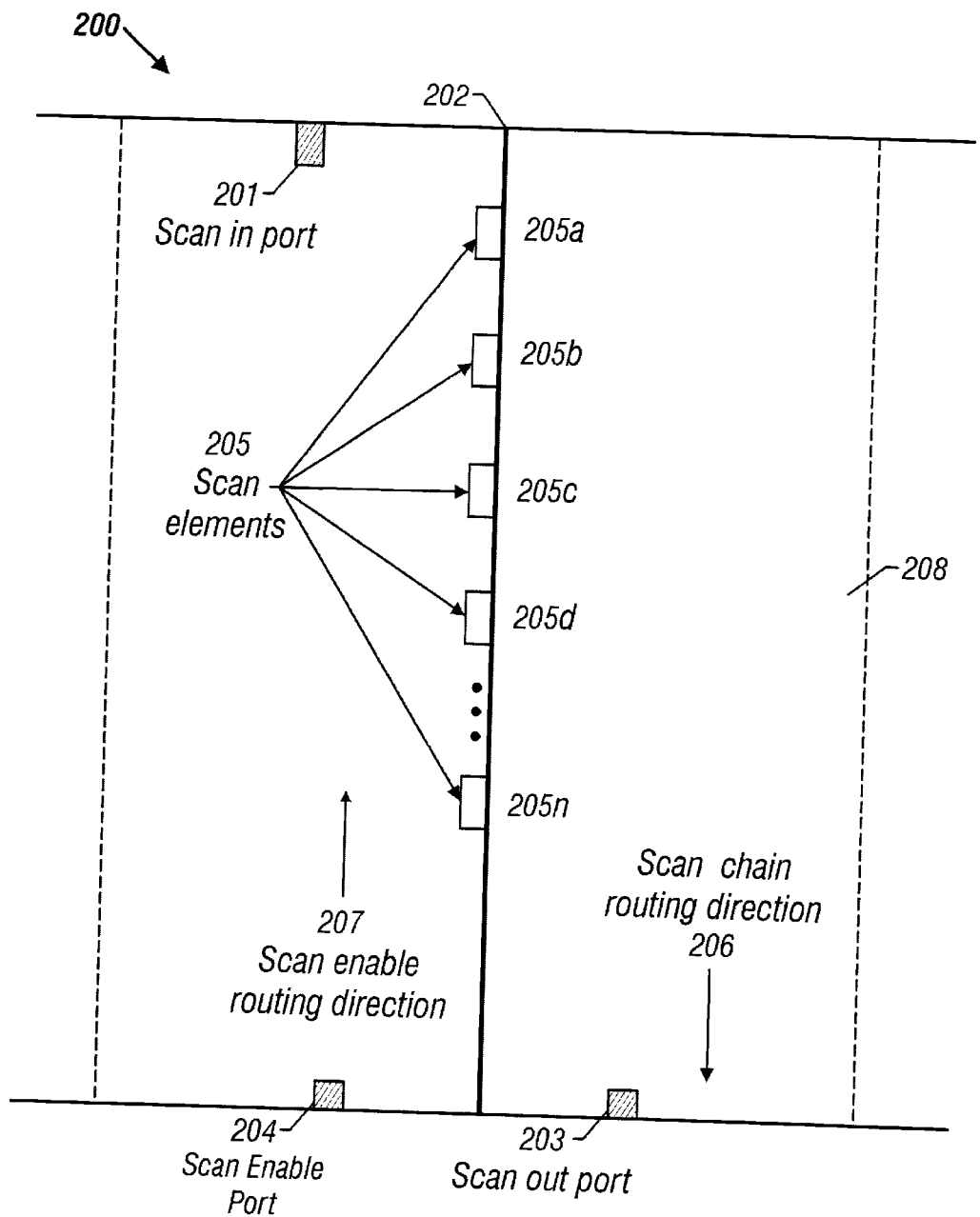
FIG. 2 depicts data scan and scan enable propagation directions along a single trunk line according to a preferred embodiment of the present invention.

FIG. 2 depicts scan data propagation and scan enable signal propagation directions along a single trunk line 202 according to a preferred embodiment of the present invention. The rapid propagation of scan data among scan elements within blocks of ICs makes it important to ensure that race conditions do not modify data in an element prior to such data being properly transmitted to a next location in its transmission path. However, where data transmission among various elements, such as scan elements, is left open to the random effects of data propagation within a complex circuit, such race conditions and the attendant risk of unintended data destruction may occur. The inventive mechanism therefore presents an approach which preferably prevents race conditions when transferring data among the scan elements 205.

In a preferred embodiment, certain steps may be implemented to help the place and route tool provide an initial timing driven placement of scan elements. One action which may aid the place and route tool is the strategic placement of scan ports within a functional block. Separately, pre-ordering the scan chain, by reducing a scan chain, and partitioning it according to clock regions, permits the scan elements to be efficiently ordered employing a simple algorithm to create a zig zag pattern within the functional block. The permissible width of this zig zag pattern is generally determined by the skew tolerance of each scan element. In a preferred embodiment, another step which may assist a place and route tool is net weighting. Net weighting is a mechanism for causing the place and route tool to route selected signals with higher priority, thereby providing such signals with preferential treatment.

With reference to FIG. 2, the order in which various forms of routing are performed on the scan elements may be manipulated in order to allow for more skew tolerance for the scan enable signal by slowing down propagation of scan data. Clock, scan enable, and functional signal flow paths are preferably routed first. The scan data path is preferably routed thereafter. In this manner, there will be preferably be more skew tolerance for the scan enable signal because the order in which routing is performed preferably operates to slow down propagation of the scan data.

In a preferred embodiment, data enters block 200 at scan in port 201. The scan data is then preferably propagated along scan chain routing direction, scan chain data routing direction, or scan data propagation direction 206 through a plurality of scan elements 205a through 205n, and then leaves block 200 via scan-out port 203. The scan data is preferably routed in proximity to clock trunk line 202. Although FIG. 2 depicts scan elements 205 as being disposed in close proximity to clock trunk line 202, it will be appreciated that scan elements 205 could be disposed anywhere within clock region 208 and be conductively coupled to clock trunk line 202.

In a preferred embodiment, shift port or scan enable port 204 transmits a signal along clock trunk line 202 in scan enable routing direction or scan enable propagation direction 207 which is preferably opposite to scan chain routing direction 206. The scan enable signal emerging from scan enable port 204 preferably travels parallel to clock trunk line 202 from bottom to top in the layout of FIG. 2 as well as to scan elements 205 which may also be connected to clock trunk line 202 employing tributary conductive paths.

In a preferred embodiment, the scan enable routing direction 207 operates to ensure that data within the scan chain (which preferably includes the scan elements as well as scan in port 203 and scan out port 204) proceeds through scan elements 205 without being overrun or destroyed by data being transmitted out of turn among the scan elements 205. As the scan enable signal proceeds from the bottom of block 200 in FIG. 2, it will preferably reach element 205(n) first, thereby enabling element 205n to transmit its scan data down toward scan out port 203. Since the scan enable signal has preferably not yet reached any of the scan elements upstream from element 205(n) (the elements above element 205(n)), the data in element 205(n) preferably will not be overwritten until after element 205(n) has transmitted its data downstream toward scan out port 203. Preferably, this order of events is repeated as the scan enable signal emerging from scan enable port 204 propagates up clock trunk 202 toward elements 205(d), 205(c), and so forth. In each case, the scan enable signal preferably reaches each element before any scan element located upstream (that is, upstream in the scan chain routing direction 206) from the element has a chance to transmit data out of turn and destroy data in a scan element before such data is transmitted in the downstream, in scan chain routing direction 206. Preferably, a certain amount of skew tolerance may be built into the scan elements to provide still further protection against the development of race conditions. In this manner, race conditions among the scan elements 205 are preferably eliminated.

Where a sequence of gates is connected in a particular order within a functional block, the difference in arrival time of a signal propagating through the sequence of gates at two successive gates along the sequence is referred to herein as "skew." In a preferred embodiment, setting the scan enable routing direction opposite that of the scan chain routing direction enables the skew generally present for both signals to work toward avoiding race conditions rather than causing them. Accordingly, the present invention organizes the direction of scan enable and scan chain signal propagation to beneficially employ the existence of skew present in both signals. This represents an advantage over prior art systems in which the presence of skew in signal propagation within functional blocks generally operates to cause race conditions.

Figure 3:
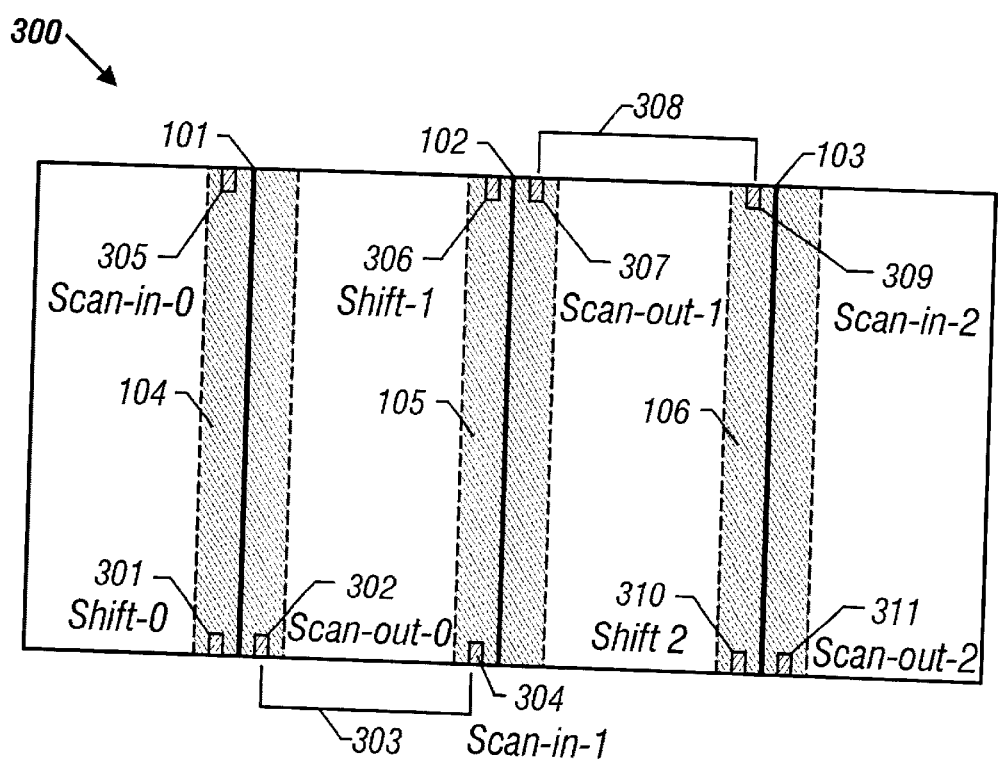
FIG. 3 depicts a sequence of partitioned scan chains connected in series according to a preferred embodiment of the present invention.

FIG. 3 depicts a sequence of partitioned scan chains connected in series according to a preferred embodiment of the present invention. FIG. 3 depicts the beneficial effects of extending the partitioning discussed in connection with FIG. 1 and the reverse direction scan enable signal, or shift signal, discussed in connection with FIG. 2, to an entire functional block 300 of an IC. In this manner, all scan elements within block 300 may be connected in a single-series connected or daisy-chained sequence of scan chains, each having their respective clock regions 104–106.

In a preferred embodiment, some level of intervention may be advantageously employed in between the clock trunk lines. Running a single clock trunk line through the entirety of block 300 might overload such a line. Therefore, a plurality of appropriately driven trunk lines, connected in parallel, preferably offers advantages over the use of a single trunk line for the whole of block 300.

In a preferred embodiment scan chains disposed within regions 104, 105, and 106, may be linked or stitched together to form a single scan chain. The implementation of the connecting links between the scan chains may be implemented manually. Therefore, although some manual connection may be involved when employing this approach, such effort is much reduced in comparison with that generally required in the prior art which included having to manually connect all the scan elements. Although FIG. 3 depicts a series connection between three scan chains, it will be appreciated that fewer or more than three scan chains could be so connected, and all such variations are included within the scope of the present invention.

In a preferred embodiment, the scan chain runs from scan-in 0 305 to scan-out 2 311 the intermediate points of which are discussed in the following. It will be appreciated that for each of the individual clock trunk lines, the scan chain routing and scan enable routing directions apply. Specifically, the scan enable routing direction is preferably opposite the direction of scan chain (data) routing for each of the three clock trunk lines. Beginning with clock trunk line 0 101, the scan chain path preferably begins with scan-in port 0 305 and proceeds down clock trunk line 101 to scan-out port 0 302. It is noted that the scan enable signal from shift port 0 (or scan enable port 0) 301 preferably propagates upward in the layout of FIG. 3, opposite the direction of scan chain data propagation.

In a preferred embodiment, link or stitch 303 connects scan-out 0 port 302 to scan-in 1 port 304. The scan chain then preferably proceeds up clock trunk line 102 to scan-out 1 port 307. Link or stitch 308 is preferably employed to extend the scan chain to scan in 2 port 309. The scan chain then preferably proceeds down clock trunk line 103 to scan-out 2 port 311 thus completing a scan chain which preferably encompasses the totality of scan elements within block 300. Preferably, the scan chain could optionally be extended still further by connecting the output from scan-out port 2 311 to an input to another entire block, thereby still further consolidating the scan chain data path for an IC. Generally, a certain amount of manual intervention may be employed when connecting two or more blocks together, however the economies of scale obtained when dealing with larger and larger entities as operational units tends to require substantially less manual intervention than did systems of the prior art.

In a preferred embodiment, gathering data regarding the properties of the data path of the clock trunk lines is preferably much easier than was the case with prior art systems. For example, early capacitance estimates may be made when connecting the scan elements to clock trunk lines. Considerable design advantage may be obtained when such capacitance estimates and other operating data are available early in a design process.

Figure 4:
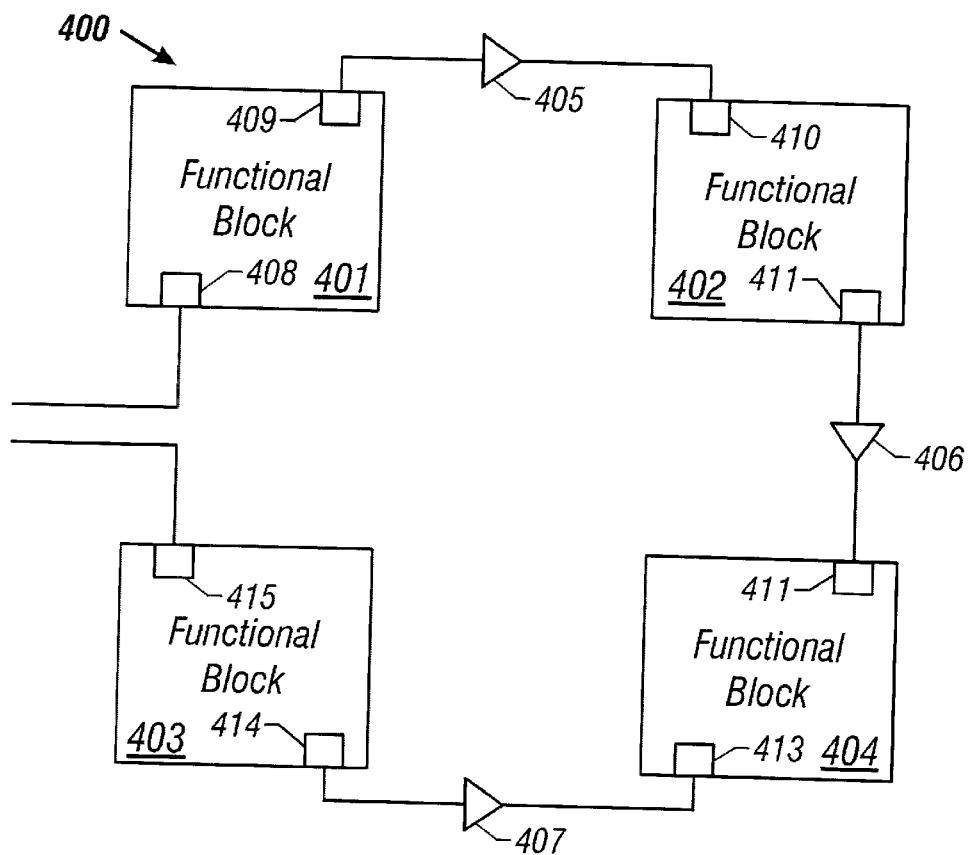
FIG. 4 depicts a plurality of functional blocks having interconnected scan chains according to a preferred embodiment of the present invention.

FIG. 4 depicts a plurality 400 of functional blocks having interconnected scan chains according to a preferred embodiment of the present invention. In a preferred embodiment, once a plurality of scan chains are stitched together to form a single daisy chained connection with each of a plurality of functional blocks, the connected scan chains within various different functional blocks may be interconnected to form a continuous link of daisy chained scan chains spanning two or more functional blocks. Delay circuitry may optionally be deployed between functional blocks to eliminate race conditions.

An exemplary implementation of the above-described interconnection of scan chains belonging to different functional blocks is depicted in FIG. 4. Functional blocks 401–404 are shown connected. Generally, a first scan chain is formed between scan in port 408 and scan out port 409 in functional block 401, a second scan chain between scan in port 410 and scan out port 411 in functional block 402, a third scan chain between scan in port 412 and scan out port 413 in functional block 404 and a fourth scan chain between scan in port 414 and scan out port 415 in functional block 403. Delay circuitry in the form of buffers 405, 406, and 407 is shown deployed between functional blocks 401 and 402, between blocks 402 and 404, and between blocks 404 and 403 respectively. Deployment of the buffers as shown preferably operates to eliminate race conditions between the blocks.

Figure 5:
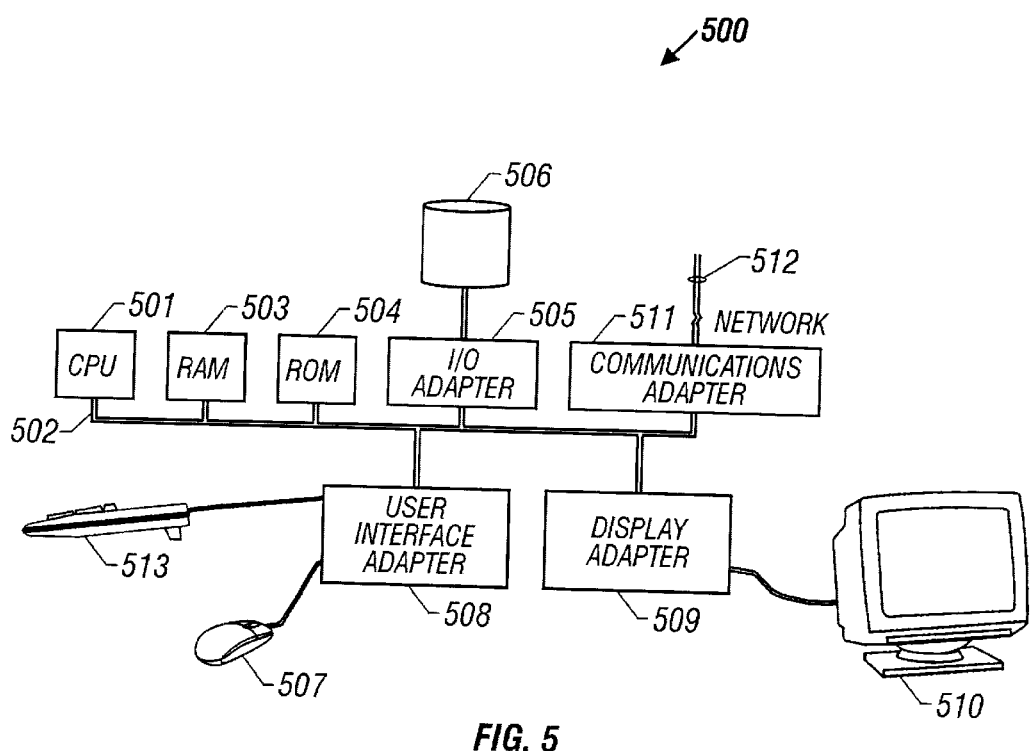
FIG. 5 depicts computer equipment adaptable for use with a preferred embodiment of the present invention.

FIG. 5 illustrates computer system 500 adaptable for use with a preferred embodiment of the present invention. Central processing unit (CPU) 501 is coupled to system bus 502. The CPU 501 may be any general purpose CPU, such as an HP PA-8200. However, the present invention is not restricted by the architecture of CPU 501 as long as CPU 501 supports the inventive operations as described herein. Bus 502 is coupled to random access memory (RAM) 503, which may be SRAM, DRAM, or SDRAM. ROM 504 is also coupled to bus 502, which may be PROM, EPROM, or EEPROM. RAM 503 and ROM 504 hold user and system data and programs as is well known in the art.

The bus 502 is also coupled to input/output (I/O) adapter 505, communications adapter card 511, user interface adapter 508, and display adapter 509. The I/O adapter 505 connects to storage devices 506, such as one or more of hard drive, CD drive, floppy disk drive, tape drive, to the computer system. Communications adapter 511 is adapted to couple the computer system 500 to a network 512, which may be one or more of local (LAN), wide-area (WAN), Ethernet or Internet network. User interface adapter 508 couples user input devices, such as keyboard 513 and pointing device 507, to the computer system 500. The display adapter 509 is driven by CPU 501 to control the display on display device 510.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for disposing scan elements in a functional block of an integrated circuit to provide efficient scan chain operation, the method comprising the steps of:

providing a timing driven initial placement for said scan elements in said functional block;

relocating each scan element of said initially placed scan elements in said functional block to a nearest clock region compatible with said each scan element;

connecting said relocated scan elements to a clock trunk line within said nearest clock region;

disposing a scan-in port in said nearest clock region;

arranging said scan elements in a sequence within said nearest clock region;

disposing a scan-out port in said nearest clock region;

connecting said scan-in port, said arranged scan elements and said scan-out port, thereby forming a scan chain portion within said nearest clock region;

establishing a scan chain data routing direction running from said scan-in port through said arranged scan elements through said scan-out port within said nearest clock region; and establishing a scan enable routing direction opposite said scan chain data routing direction in said nearest clock region.

2. The method of claim 1 comprising the further step of: disposing a plurality of clock regions within said block.

3. The method of claim 2 comprising the further step of: disposing one clock trunk line in each clock region of said clock regions.

4. The method of claim 3 further comprising the step of: connecting scan chains disposed within each of said clock regions in series, thereby forming a single scan chain encompassing substantially all scan elements within said block.

5. The method of claim 4 further comprising the step of: connecting said block in series with at least one other block to thereby form a scan chain encompassing a plurality of blocks within said integrated circuit.

6. The method of claim 1 further comprising the step of: automatically performing said steps of providing, relocating, and connecting employing a computer aided design tool.

7. The method of claim 1 further comprising the step of: partitioning said clock trunk line into a plurality of operational segments.

8. An apparatus for avoiding race conditions in a scan chain disposed within a functional block of an integrated circuit, the apparatus comprising:

a plurality of clock regions disposed within said functional block;

a clock trunk line disposed within each clock region of said clock regions;

a plurality of scan elements disposed within each clock region of said clock regions and conductively coupled to said clock trunk line disposed within said each clock region;

scan routing data propagation in a first direction in said each clock region; and a scan enable signal propagation in a second direction opposite said first direction in said each clock region, thereby preventing race conditions among said plurality of scan elements.

9. The apparatus of claim 8 further comprising:

a scan-in port for admitting scan data to said plurality of scan elements disposed within said each clock region; and a scan-out port for transmitting data out of said each clock region from said plurality of scan elements.

10. The apparatus of claim 8, further comprising:

a shift port for triggering said scan enable signal.

11. The apparatus of claim 8 further comprising:

at least one conductive link for coupling together ports of said plurality of clock regions to thereby form a single scan chain encompassing an entirety of said scan elements within said functional block of said integrated circuit.

12. A system for providing a manageable sequence of scan chain elements within a functional block of an integrated circuit, the system comprising:

means for initially locating said scan elements within said functional block;

means for establishing a plurality of clock regions within said functional block;

means for disposing a clock trunk line within each clock region of said plurality of clock regions;

means for relocating said initially located scan elements to selected clock regions within said functional block;

means for routing scan chain data in a first direction within each clock region of said clock regions; and means for routing scan enable signals in a second direction opposite said first direction within each clock region of said clock regions, thereby avoiding race conditions for scan chain data among said plurality of scan elements.

13. The system of claim 12 further comprising:

means for selecting a clock region for each scan element which is closest to said scan element.

14. The system of claim 12 further comprising:

means for partitioning at least one clock trunk line into a plurality of segments to reduce a load on said at least one clock trunk line.

15. The system of claim 12 further comprising:

means for connecting said clock trunk lines disposed within each of said clock regions in series, thereby forming a single scan chain linking substantially all of said scan elements in said functional block.

16. The system of claim 12 further comprising:

means for connecting said block in series with at least one other block to thereby form a scan chain encompassing a plurality of blocks within said integrated circuit.

17. A computerized-method of creating an integrated circuit design, comprising:

creating a plurality of clock regions for an integrated circuit;

receiving a set of directives specifying at least provisional placements of a plurality scan-elements in said integrated circuit;

optimizing said provisional placements of said plurality of scan-elements according to a timing driven process defined by at least a cost function;

relocating each of said plurality of scan-elements to a nearest compatible clock region of said plurality of clock regions; and creating said integrated circuit-design, wherein said integrated circuit design includes said relocated plurality of scan-elements.

18. The computerized-method of claim 17 further comprising:

connecting each of said plurality of scan-elements to a dedicated clock trunk line of an associated nearest clock region of said plurality of clock regions.

19. The computerized-method of claim 17 further comprising:

adapting said plurality of scan-elements such that a scan path of said plurality of scan-elements propagates data in a direction that is opposite to a propagation direction of a scan-enable signal of said scan path.

20. The method of claim 19 wherein said receiving a set of directives, comprises:

receiving initial positions of a scan-in port and a scan-out port.

21. An integrated circuit, comprising:

a scan-out port for communicating data from the integrated circuit;

a scan-enable port for receiving a scan-enable signal for initiating communication of data via said scan-out port; and a scan chain that comprises a plurality of scan elements and is coupled to said scan-out port and said scan-enable port, wherein each of said plurality of scan elements communicates scan data in a first direction along said scan chain when it receives said scan-enable signal, each of said plurality of scan elements communicates said scan-enable signal in a second direction along said scan chain when it receives said scan-enable signal, and said first direction and said second direction are opposite.

22. The integrated circuit of claim 21 further comprising:

a conductive link for coupling said scan-out port to a second scan chain of said integrated circuit.

23. The integrated circuit of claim 21 wherein said plurality of scan elements are disposed in a clock region.

24. The integrated circuit of claim 21 wherein said clock region possesses a dedicated clock trunk line.

* * * * *